United States Patent
Gorrell

(10) Patent No.: US 7,728,702 B2
(45) Date of Patent: Jun. 1, 2010

(54) SHIELDING OF INTEGRATED CIRCUIT PACKAGE WITH HIGH-PERMEABILITY MAGNETIC MATERIAL

(75) Inventor: Jonathan Gorrell, Gainesville, FL (US)

(73) Assignee: Virgin Islands Microsystems, Inc., St. Thomas, VI (US)

( * ) Notice: Subject to any disclaimer, the term of this patent is extended or adjusted under 35 U.S.C. 154(b) by 266 days.

(21) Appl. No.: 11/418,083

(22) Filed: May 5, 2006

(65) Prior Publication Data

US 2008/0067941 A1    Mar. 20, 2008

(51) Int. Cl.
*H01P 7/00*    (2006.01)
(52) U.S. Cl. ...................................... 333/219
(58) Field of Classification Search ................. 333/219; 343/841; 398/212
See application file for complete search history.

(56) References Cited

U.S. PATENT DOCUMENTS

| | | |
|---|---|---|
| 1,948,384 A | 2/1934 | Lawrence |
| 2,307,086 A | 1/1943 | Varian et al. |
| 2,431,396 A | 11/1947 | Hansell |
| 2,473,477 A | 6/1949 | Smith |
| 2,634,372 A | 4/1953 | Salisbury |
| 2,932,798 A | 4/1960 | Kerst et al. |
| 2,944,183 A | 7/1960 | Drexler |
| 2,966,611 A | 12/1960 | Sandstrom |
| 3,231,779 A | 1/1966 | White |
| 3,274,428 A | 9/1966 | Wreford |
| 3,297,905 A | 1/1967 | Rockwell et al. |
| 3,315,117 A | 4/1967 | Udelson |
| 3,387,169 A | 6/1968 | Farney |
| 3,543,147 A | 11/1970 | Kovarik |
| 3,546,524 A | 12/1970 | Stark |
| 3,560,694 A | 2/1971 | White |
| 3,571,642 A | 3/1971 | Westcott |
| 3,586,899 A | 6/1971 | Fleisher |
| 3,761,828 A | 9/1973 | Pollard et al. |
| 3,886,399 A | 5/1975 | Symons |
| 3,923,568 A | 12/1975 | Bersin |
| 3,989,347 A | 11/1976 | Eschler |
| 4,053,845 A | 10/1977 | Gould |

(Continued)

FOREIGN PATENT DOCUMENTS

EP    0237559 B1    12/1991

(Continued)

OTHER PUBLICATIONS

U.S. Appl. No. 11/418,082, filed May 5, 2006, Gorrell et al.

(Continued)

*Primary Examiner*—Robert Pascal
*Assistant Examiner*—Kimberly E Glenn
(74) *Attorney, Agent, or Firm*—Davidson Berquist Jackson & Gowdey LLP

(57) ABSTRACT

A device includes at least one ultra-small resonant structure; and shielding constructed and adapted to shield at least a portion of said ultra-small resonant structure with a high-permeability magnetic material. The magnetic material is formed from a substance selected from a non-conductive magnetic oxide such as a ferrite; a cobaltite, a chromite, and a manganite. The magnetic material may be mumetal, permalloy, Hipernom, HyMu-80, supermalloy, supermumetal, nilomag, sanbold, Mo-Permalloy, Ultraperm, or M-1040.

48 Claims, 1 Drawing Sheet

U.S. PATENT DOCUMENTS

| | | |
|---|---|---|
| 4,269,672 A | 5/1981 | Inoue |
| 4,282,436 A | 8/1981 | Kapetanakos et al. |
| 4,296,354 A | 10/1981 | Neubauer |
| 4,450,554 A | 5/1984 | Steensma et al. |
| 4,453,108 A | 6/1984 | Freeman, Jr. |
| 4,482,779 A | 11/1984 | Anderson |
| 4,528,659 A | 7/1985 | Jones, Jr. |
| 4,589,107 A | 5/1986 | Middleton et al. |
| 4,598,397 A | 7/1986 | Nelson et al. |
| 4,630,262 A | 12/1986 | Callens et al. |
| 4,652,703 A | 3/1987 | Lu et al. |
| 4,661,783 A | 4/1987 | Gover et al. |
| 4,704,583 A | 11/1987 | Gould |
| 4,712,042 A | 12/1987 | Hamm |
| 4,713,581 A | 12/1987 | Haimson |
| 4,727,550 A | 2/1988 | Chang et al. |
| 4,740,963 A | 4/1988 | Eckley |
| 4,740,973 A | 4/1988 | Madey |
| 4,746,201 A | 5/1988 | Gould |
| 4,761,059 A | 8/1988 | Yeh et al. |
| 4,782,485 A | 11/1988 | Gollub |
| 4,789,945 A | 12/1988 | Niijima |
| 4,806,859 A * | 2/1989 | Hetrick .................. 324/207.15 |
| 4,809,271 A | 2/1989 | Kondo et al. |
| 4,813,040 A | 3/1989 | Futato |
| 4,819,228 A | 4/1989 | Baran et al. |
| 4,829,527 A | 5/1989 | Wortman et al. |
| 4,838,021 A | 6/1989 | Beattie |
| 4,841,538 A | 6/1989 | Yanabu et al. |
| 4,864,131 A | 9/1989 | Rich et al. |
| 4,866,704 A | 9/1989 | Bergman |
| 4,866,732 A | 9/1989 | Carey et al. |
| 4,873,715 A | 10/1989 | Shibata |
| 4,887,265 A | 12/1989 | Felix |
| 4,890,282 A | 12/1989 | Lambert et al. |
| 4,898,022 A | 2/1990 | Yumoto et al. |
| 4,912,705 A | 3/1990 | Paneth et al. |
| 4,932,022 A | 6/1990 | Keeney et al. |
| 4,981,371 A | 1/1991 | Gurak et al. |
| 5,023,563 A | 6/1991 | Harvey et al. |
| 5,036,513 A | 7/1991 | Greenblatt |
| 5,065,425 A | 11/1991 | Lecomte et al. |
| 5,113,141 A | 5/1992 | Swenson |
| 5,121,385 A | 6/1992 | Tominaga et al. |
| 5,127,001 A | 6/1992 | Steagall et al. |
| 5,128,729 A | 7/1992 | Alonas et al. |
| 5,130,985 A | 7/1992 | Kondo et al. |
| 5,150,410 A | 9/1992 | Bertrand |
| 5,155,726 A | 10/1992 | Spinney et al. |
| 5,157,000 A | 10/1992 | Elkind et al. |
| 5,163,118 A | 11/1992 | Lorenzo et al. |
| 5,185,073 A | 2/1993 | Bindra |
| 5,187,591 A | 2/1993 | Guy et al. |
| 5,199,918 A | 4/1993 | Kumar |
| 5,214,650 A | 5/1993 | Renner et al. |
| 5,233,623 A | 8/1993 | Chang |
| 5,235,248 A | 8/1993 | Clark et al. |
| 5,262,656 A | 11/1993 | Blondeau et al. |
| 5,263,043 A | 11/1993 | Walsh |
| 5,268,693 A | 12/1993 | Walsh |
| 5,268,788 A | 12/1993 | Fox et al. |
| 5,282,197 A | 1/1994 | Kreitzer |
| 5,283,819 A | 2/1994 | Glick et al. |
| 5,293,175 A | 3/1994 | Hemmie et al. |
| 5,302,240 A | 4/1994 | Hori et al. |
| 5,305,312 A | 4/1994 | Fornek et al. |
| 5,341,374 A | 8/1994 | Lewen et al. |
| 5,354,709 A | 10/1994 | Lorenzo et al. |
| 5,446,814 A | 8/1995 | Kuo et al. |
| 5,485,277 A | 1/1996 | Foster |
| 5,504,341 A | 4/1996 | Glavish |
| 5,578,909 A | 11/1996 | Billen |
| 5,604,352 A | 2/1997 | Schuetz |
| 5,608,263 A | 3/1997 | Drayton et al. |
| 5,637,966 A | 6/1997 | Umstadter et al. |
| 5,663,971 A | 9/1997 | Carlsten |
| 5,666,020 A | 9/1997 | Takemura |
| 5,668,368 A | 9/1997 | Sakai et al. |
| 5,705,443 A | 1/1998 | Stauf et al. |
| 5,737,458 A | 4/1998 | Wojnarowski et al. |
| 5,744,919 A | 4/1998 | Mishin et al. |
| 5,757,009 A | 5/1998 | Walstrom |
| 5,767,013 A | 6/1998 | Park |
| 5,780,970 A | 7/1998 | Singh et al. |
| 5,790,585 A | 8/1998 | Walsh |
| 5,811,943 A | 9/1998 | Mishin et al. |
| 5,821,836 A | 10/1998 | Katehi et al. |
| 5,821,902 A | 10/1998 | Keen |
| 5,825,140 A | 10/1998 | Fujisawa |
| 5,831,270 A | 11/1998 | Nakasuji |
| 5,847,745 A | 12/1998 | Shimizu et al. |
| 5,858,799 A | 1/1999 | Yee et al. |
| 5,889,449 A | 3/1999 | Fiedziuszko |
| 5,889,797 A | 3/1999 | Nguyen |
| 5,902,489 A | 5/1999 | Yasuda et al. |
| 5,963,857 A * | 10/1999 | Greywall .................... 455/307 |
| 5,972,193 A | 10/1999 | Chou et al. |
| 6,005,347 A | 12/1999 | Lee |
| 6,008,496 A | 12/1999 | Winefordner et al. |
| 6,040,625 A | 3/2000 | Ip |
| 6,060,833 A | 5/2000 | Velazco |
| 6,080,529 A | 6/2000 | Ye et al. |
| 6,117,784 A | 9/2000 | Uzoh |
| 6,139,760 A | 10/2000 | Shim et al. |
| 6,180,415 B1 | 1/2001 | Schultz et al. |
| 6,195,199 B1 | 2/2001 | Yamada |
| 6,210,555 B1 | 4/2001 | Taylor et al. |
| 6,222,866 B1 | 4/2001 | Seko |
| 6,278,239 B1 | 8/2001 | Caporaso et al. |
| 6,281,769 B1 | 8/2001 | Fiedziuszko |
| 6,297,511 B1 | 10/2001 | Syllaios et al. |
| 6,301,041 B1 | 10/2001 | Yamada |
| 6,303,014 B1 | 10/2001 | Taylor et al. |
| 6,309,528 B1 | 10/2001 | Taylor et al. |
| 6,316,876 B1 | 11/2001 | Tanabe |
| 6,338,968 B1 | 1/2002 | Hefti |
| 6,370,306 B1 | 4/2002 | Sato et al. |
| 6,373,194 B1 | 4/2002 | Small |
| 6,376,258 B2 | 4/2002 | Hefti |
| 6,407,516 B1 | 6/2002 | Victor |
| 6,441,298 B1 | 8/2002 | Thio |
| 6,448,850 B1 | 9/2002 | Yamada |
| 6,453,087 B2 | 9/2002 | Frish et al. |
| 6,470,198 B1 | 10/2002 | Kintaka et al. |
| 6,504,303 B2 | 1/2003 | Small |
| 6,524,461 B2 | 2/2003 | Taylor et al. |
| 6,525,477 B2 | 2/2003 | Small |
| 6,534,766 B2 | 3/2003 | Abe et al. |
| 6,545,425 B2 | 4/2003 | Victor |
| 6,552,320 B1 | 4/2003 | Pan |
| 6,577,040 B2 | 6/2003 | Nguyen |
| 6,580,075 B2 | 6/2003 | Kametani et al. |
| 6,603,781 B1 | 8/2003 | Stinson et al. |
| 6,603,915 B2 | 8/2003 | Glebov et al. |
| 6,624,916 B1 | 9/2003 | Green et al. |
| 6,636,185 B1 | 10/2003 | Spitzer et al. |
| 6,636,534 B2 | 10/2003 | Madey et al. |
| 6,636,653 B2 | 10/2003 | Miracky et al. |
| 6,640,023 B2 | 10/2003 | Miller et al. |
| 6,642,907 B2 | 11/2003 | Hamada et al. |
| 6,687,034 B2 | 2/2004 | Wine et al. |
| 6,700,748 B1 | 3/2004 | Cowles et al. |
| 6,724,486 B1 | 4/2004 | Shull et al. |
| 6,738,176 B2 | 5/2004 | Rabinowitz et al. |

| | | | | | |
|---|---|---|---|---|---|
| 6,741,781 B2 | 5/2004 | Furuyama | 2002/0139961 A1 | 10/2002 | Kinoshita et al. |
| 6,777,244 B2 | 8/2004 | Pepper et al. | 2002/0158295 A1 | 10/2002 | Armgarth et al. |
| 6,782,205 B2 | 8/2004 | Trisnadi et al. | 2002/0191650 A1 | 12/2002 | Madey et al. |
| 6,791,438 B2 | 9/2004 | Takahashi et al. | 2003/0010979 A1 | 1/2003 | Pardo et al. |
| 6,800,877 B2 | 10/2004 | Victor et al. | 2003/0012925 A1 | 1/2003 | Gorrell |
| 6,801,002 B2 | 10/2004 | Victor et al. | 2003/0016421 A1 | 1/2003 | Small |
| 6,819,432 B2 | 11/2004 | Pepper et al. | 2003/0034535 A1 | 2/2003 | Barenburu et al. |
| 6,829,286 B1 | 12/2004 | Guilfoyle et al. | 2003/0103150 A1 | 6/2003 | Catrysse et al. |
| 6,834,152 B2 | 12/2004 | Gunn et al. | 2003/0106998 A1 | 6/2003 | Colbert et al. |
| 6,870,438 B1 | 3/2005 | Shino et al. | 2003/0155521 A1 | 8/2003 | Feuerbaum |
| 6,871,025 B2 | 3/2005 | Maleki et al. | 2003/0158474 A1 | 8/2003 | Scherer et al. |
| 6,885,262 B2 | 4/2005 | Nishimura et al. | 2003/0164947 A1 | 9/2003 | Vaupel |
| 6,900,447 B2 | 5/2005 | Gerlach et al. | 2003/0179974 A1 | 9/2003 | Estes et al. |
| 6,908,355 B2 | 6/2005 | Habib et al. | 2003/0206708 A1 | 11/2003 | Estes et al. |
| 6,909,092 B2 | 6/2005 | Nagahama et al. | 2003/0214695 A1 | 11/2003 | Abramson et al. |
| 6,909,104 B1 | 6/2005 | Koops | 2003/0222579 A1 | 12/2003 | Habib et al. |
| 6,924,920 B2 | 8/2005 | Zhilkov | 2004/0011432 A1 | 1/2004 | Podlaha et al. |
| 6,936,981 B2 | 8/2005 | Gesley | 2004/0061053 A1 | 4/2004 | Taniguchi et al. |
| 6,943,650 B2 | 9/2005 | Ramprasad et al. | 2004/0080285 A1 | 4/2004 | Victor et al. |
| 6,944,369 B2 | 9/2005 | Deliwala | 2004/0085159 A1 | 5/2004 | Kubena et al. |
| 6,952,492 B2 | 10/2005 | Tanaka et al. | 2004/0092104 A1 | 5/2004 | Gunn, III et al. |
| 6,953,291 B2 | 10/2005 | Liu | 2004/0108471 A1 | 6/2004 | Luo et al. |
| 6,954,515 B2 | 10/2005 | Bjorkholm et al. | 2004/0108473 A1 | 6/2004 | Melnychuk et al. |
| 6,965,284 B2 | 11/2005 | Maekawa et al. | 2004/0108823 A1 | 6/2004 | Amaldi et al. |
| 6,965,625 B2 | 11/2005 | Mross et al. | 2004/0136715 A1 | 7/2004 | Kondo |
| 6,972,439 B1 | 12/2005 | Kim et al. | 2004/0150991 A1 | 8/2004 | Ouderkirk et al. |
| 6,995,406 B2 | 2/2006 | Tojo et al. | 2004/0154925 A1 | 8/2004 | Podlaha et al. |
| 7,010,183 B2 | 3/2006 | Estes et al. | 2004/0171272 A1 | 9/2004 | Jin et al. |
| 7,064,500 B2 | 6/2006 | Victor et al. | 2004/0180244 A1 | 9/2004 | Tour et al. |
| 7,068,948 B2 | 6/2006 | Wei et al. | 2004/0184270 A1 | 9/2004 | Halter |
| 7,092,588 B2 | 8/2006 | Kondo | 2004/0213375 A1 | 10/2004 | Bjorkholm et al. |
| 7,092,603 B2 | 8/2006 | Glebov et al. | 2004/0217297 A1 | 11/2004 | Moses et al. |
| 7,099,586 B2 | 8/2006 | Yoo | 2004/0218651 A1 | 11/2004 | Iwasaki et al. |
| 7,120,332 B1 | 10/2006 | Spoonhower et al. | 2004/0231996 A1 | 11/2004 | Webb |
| 7,122,978 B2 | 10/2006 | Nakanishi et al. | 2004/0240035 A1 | 12/2004 | Zhilkov |
| 7,130,102 B2 | 10/2006 | Rabinowitz | 2004/0264867 A1 | 12/2004 | Kondo |
| 7,177,515 B2 | 2/2007 | Estes et al. | 2005/0023145 A1 | 2/2005 | Cohen et al. |
| 7,194,798 B2 | 3/2007 | Bonhote et al. | 2005/0045821 A1 | 3/2005 | Noji et al. |
| 7,230,201 B1 | 6/2007 | Miley et al. | 2005/0045832 A1 | 3/2005 | Kelly et al. |
| 7,253,426 B2 | 8/2007 | Gorrell et al. | 2005/0054151 A1 | 3/2005 | Lowther et al. |
| 7,267,459 B2 | 9/2007 | Matheson | 2005/0062903 A1 | 3/2005 | Cok et al. |
| 7,267,461 B2 | 9/2007 | Kan et al. | 2005/0067286 A1 | 3/2005 | Ahn et al. |
| 7,309,953 B2 | 12/2007 | Tiberi et al. | 2005/0082469 A1 | 4/2005 | Carlo |
| 7,342,441 B2 | 3/2008 | Gorrell et al. | 2005/0092929 A1 | 5/2005 | Schneiker |
| 7,359,589 B2 | 4/2008 | Gorrell et al. | 2005/0104684 A1 | 5/2005 | Wojcik |
| 7,361,916 B2 | 4/2008 | Gorrell et al. | 2005/0105595 A1 | 5/2005 | Martin et al. |
| 7,362,972 B2 | 4/2008 | Yavor et al. | 2005/0105690 A1 | 5/2005 | Pau et al. |
| 7,375,631 B2 * | 5/2008 | Moskowitz et al. ...... 340/572.1 | 2005/0145882 A1 | 7/2005 | Taylor et al. |
| 7,436,177 B2 | 10/2008 | Gorrell et al. | 2005/0152635 A1 | 7/2005 | Paddon et al. |
| 7,442,940 B2 | 10/2008 | Gorrell et al. | 2005/0162104 A1 | 7/2005 | Victor et al. |
| 7,443,358 B2 | 10/2008 | Gorrell et al. | 2005/0180678 A1 | 8/2005 | Panepucci et al. |
| 7,459,099 B2 | 12/2008 | Kubena et al. | 2005/0190637 A1 | 9/2005 | Ichimura et al. |
| 7,470,920 B2 | 12/2008 | Gorrell et al. | 2005/0191055 A1 | 9/2005 | Maruyama et al. |
| 7,473,917 B2 | 1/2009 | Singh | 2005/0194258 A1 | 9/2005 | Cohen et al. |
| 7,554,083 B2 | 6/2009 | Gorrell et al. | 2005/0201707 A1 | 9/2005 | Glebov et al. |
| 7,569,836 B2 | 8/2009 | Gorrell | 2005/0201717 A1 | 9/2005 | Matsumura et al. |
| 7,573,045 B2 | 8/2009 | Gorrell et al. | 2005/0206314 A1 | 9/2005 | Habib et al. |
| 7,586,097 B2 | 9/2009 | Gorrell et al. | 2005/0212503 A1 | 9/2005 | Deibele |
| 7,586,167 B2 | 9/2009 | Gorrell et al. | 2005/0231138 A1 | 10/2005 | Nakanishi et al. |
| 2001/0002315 A1 | 5/2001 | Schultz et al. | 2005/0249451 A1 | 11/2005 | Baehr-Jones et al. |
| 2001/0025925 A1 | 10/2001 | Abe et al. | 2005/0285541 A1 | 12/2005 | LeChevalier |
| 2001/0045360 A1 | 11/2001 | Omasa | 2006/0007730 A1 | 1/2006 | Nakamura et al. |
| 2002/0009723 A1 | 1/2002 | Hefti | 2006/0018619 A1 | 1/2006 | Helffrich et al. |
| 2002/0027481 A1 | 3/2002 | Fiedziuszko | 2006/0035173 A1 | 2/2006 | Davidson et al. |
| 2002/0036121 A1 | 3/2002 | Ball et al. | 2006/0045418 A1 | 3/2006 | Cho et al. |
| 2002/0036264 A1 | 3/2002 | Nakasuji et al. | 2006/0050269 A1 | 3/2006 | Brownell |
| 2002/0053638 A1 | 5/2002 | Winkler et al. | 2006/0060782 A1 | 3/2006 | Khursheed |
| 2002/0056645 A1 | 5/2002 | Taylor et al. | 2006/0062258 A1 | 3/2006 | Brau et al. |
| 2002/0068018 A1 | 6/2002 | Pepper et al. | 2006/0131176 A1 | 6/2006 | Hsu |
| 2002/0070671 A1 | 6/2002 | Small | 2006/0131695 A1 | 6/2006 | Kuekes et al. |
| 2002/0071457 A1 | 6/2002 | Hogan | 2006/0159131 A1 | 7/2006 | Liu et al. |
| 2002/0122531 A1 | 9/2002 | Whitham | 2006/0164496 A1 | 7/2006 | Tokutake et al. |
| 2002/0135665 A1 | 9/2002 | Gardner | 2006/0187794 A1 | 8/2006 | Harvey et al. |

| | | |
|---|---|---|
| 2006/0208667 A1 | 9/2006 | Lys et al. |
| 2006/0216940 A1 | 9/2006 | Gorrell et al. |
| 2006/0232364 A1 | 10/2006 | Koh et al. |
| 2006/0243925 A1 | 11/2006 | Barker et al. |
| 2006/0274922 A1 | 12/2006 | Ragsdale |
| 2007/0003781 A1 | 1/2007 | de Rochemont |
| 2007/0013765 A1 | 1/2007 | Hudson et al. |
| 2007/0075263 A1 | 4/2007 | Gorrell et al. |
| 2007/0075264 A1 | 4/2007 | Gorrell et al. |
| 2007/0085039 A1 | 4/2007 | Gorrell et al. |
| 2007/0086915 A1 | 4/2007 | LeBoeuf et al. |
| 2007/0116420 A1 | 5/2007 | Estes et al. |
| 2007/0146704 A1 | 6/2007 | Schmidt et al. |
| 2007/0152176 A1 | 7/2007 | Gorrell et al. |
| 2007/0154846 A1 | 7/2007 | Gorrell et al. |
| 2007/0194357 A1 | 8/2007 | Oohashi |
| 2007/0200940 A1 | 8/2007 | Gruhlke et al. |
| 2007/0238037 A1 | 10/2007 | Wuister et al. |
| 2007/0252983 A1 | 11/2007 | Tong et al. |
| 2007/0258492 A1 | 11/2007 | Gorrell |
| 2007/0258689 A1 | 11/2007 | Gorrell et al. |
| 2007/0258690 A1 | 11/2007 | Gorrell et al. |
| 2007/0258720 A1 | 11/2007 | Gorrell et al. |
| 2007/0259641 A1 | 11/2007 | Gorrell |
| 2007/0264023 A1 | 11/2007 | Gorrell et al. |
| 2007/0264030 A1 | 11/2007 | Gorrell et al. |
| 2007/0282030 A1 | 12/2007 | Anderson et al. |
| 2007/0284527 A1 | 12/2007 | Zani et al. |
| 2008/0069509 A1 | 3/2008 | Gorrell et al. |
| 2008/0218102 A1 | 9/2008 | Sliski et al. |
| 2008/0283501 A1 | 11/2008 | Roy |
| 2008/0302963 A1 | 12/2008 | Nakasuji et al. |

FOREIGN PATENT DOCUMENTS

| | | |
|---|---|---|
| JP | 2004-32323 A | 1/2004 |
| WO | WO 87/01873 | 3/1987 |
| WO | WO 93/21663 A1 | 10/1993 |
| WO | WO 00/72413 | 11/2000 |
| WO | WO 02/25785 | 3/2002 |
| WO | WO 02/077607 | 10/2002 |
| WO | WO 2004/086560 | 10/2004 |
| WO | WO 2005/015143 A2 | 2/2005 |
| WO | WO 2005/098966 | 10/2005 |
| WO | WO 2006/042239 A2 | 4/2006 |
| WO | WO 2007/081389 | 7/2007 |
| WO | WO 2007/081390 | 7/2007 |
| WO | WO 2007/081391 | 7/2007 |

OTHER PUBLICATIONS

J. C. Palais, "Fiber optic communications," Prentice Hall, New Jersey, 1998, pp. 156-158.

Search Report and Written Opinion mailed Dec. 20, 2007 in PCT Appln. No. PCT/US2006/022771.

Search Report and Written Opinion mailed Jan. 31, 2008 in PCT Appln. No. PCT/US2006/027427.

Search Report and Written Opinion mailed Jan. 8, 2008 in PCT Appln. No. PCT/US2006/028741.

Search Report and Written Opinion mailed Mar. 11, 2008 in PCT Appln. No. PCT/US2006/022679.

Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.

Markoff, John, "A Chip That Can Transfer Data Using Laser Light," The New York Times, Sep. 18, 2006.

S.M. Sze, "Semiconductor Devices Physics and Technology", 2nd Edition, Chapters 9 and 12, Copyright 1985, 2002.

Search Report and Written Opinion mailed Feb. 12, 2007 in PCT Appln. No. PCT/US2006/022682.

Search Report and Written Opinion mailed Feb. 20, 2007 in PCT Appln. No. PCT/US2006/022676.

Search Report and Written Opinion mailed Feb. 20, 2007 in PCT Appln. No. PCT/US2006/022772.

Search Report and Written Opinion mailed Feb. 20, 2007 in PCT Appln. No. PCT/US2006/022780.

Search Report and Written Opinion mailed Feb. 21, 2007 in PCT Appln. No. PCT/US2006/022684.

Search Report and Written Opinion mailed Jan. 17, 2007 in PCT Appln. No. PCT/US2006/022777.

Search Report and Written Opinion mailed Jan. 23, 2007 in PCT Appln. No. PCT/US2006/022781.

Search Report and Written Opinion mailed Mar. 7, 2007 in PCT Appln. No. PCT/US2006/022775.

Thurn-Albrecht et al., "Ultrahigh-Density Nanowire Arrays Grown in Self-Assembled Diblock Copolymer Templates", Science 290. 5499, Dec. 15, 2000, pp. 2126-2129.

"Array of Nanoklystrons for Frequency Agility or Redundancy," NASA's Jet Propulsion Laboratory, NASA Tech Briefs, NPO-21033. 2001.

"Antenna Arrays." May 18, 2002. www.tpub.com/content/neets/14183/css/14183_159.htm.

Alford, T.L. et al., "Advanced silver-based metallization patterning for ULSI applications," Microelectronic Engineering 55, 2001, pp. 383-388, Elsevier Science B.V.

Amato, Ivan, "An Everyman's Free-Electron Laser?" Science, New Series, Oct. 16, 1992, p. 401, vol. 258 No. 5081, American Association for the Advancement of Science.

Andrews, H.L. et al., "Dispersion and Attenuation in a Smith-Purcell Free Electron Laser," The American Physical Society, Physical Review Special Topics—Accelerators and Beams 8 (2005), pp. 050703-1-050703-9.

Bakhtyari, A. et al., "Horn Resonator Boosts Miniature Free-Electron Laser Power," Applied Physics Letters, May 12, 2003, pp. 3150-3152, vol. 82, No. 19, American Institute of Physics.

Bhattacharjee, Sudeep et al., "Folded Waveguide Traveling-Wave Tube Sources for Terahertz Radiation." IEEE Transactions on Plasma Science, vol. 32. No. 3, Jun. 2004, pp. 1002-1014.

Brau, C.A. et al., "Gain and Coherent Radiation from a Smith-Purcell Free Electron Laser," Proceedings of the 2004 FEL Conference, pp. 278-281.

Brownell, J.H. et al., "Improved µFEL Performance with Novel Resonator," Jan. 7, 2005, from website: www.frascati.enea.it/thz-bridge/workshop/presentations/Wednesday/We-07-Brownell.ppt.

Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.

Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.

Chuang, S.L. et al., "Smith-Purcell Radiation from a Charge Moving Above a Penetrable Grating," IEEE MTT-S Digest, 1983, pp. 405-406, IEEE.

Far-IR, Sub-MM & MM Detector Technology Workshop list of manuscripts, session 6 2002.

Feltz, W.F. et al., "Near-Continuous Profiling of Temperature, Moisture, and Atmospheric Stability Using the Atmospheric Emitted Radiance Interferometer (AERI)," Journal of Applied Meteorology, May 2003, vol. 42 No. 5, H.W. Wilson Company, pp. 584-597.

Freund, H.P. et al., "Linearized Field Theory of a Smith-Purcell Traveling Wave Tube," IEEE Transactions on Plasma Science, Jun. 2004, pp. 1015-1027, vol. 32 No. 3, IEEE.

Gallerano, G.P. et al., "Overview of Terahertz Radiation Sources," Proceedings of the 2004 FEL Conference, pp. 216-221.

Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.

Gover, A. et al., "Angular Radiation Pattern of Smith-Purcell Radiation," Journal of the Optical Society of America, Oct. 1984, pp. 723-728, vol. 1 No. 5, Optical Society of America.

Grishin, Yu. A. et al., "Pulsed Orotron—A New Microwave Source for Submillimeter Pulse High-Field Electron Paramagnetic Resonance Spectroscopy," Review of Scientific Instruments, Sep. 2004, pp. 2926-2936, vol. 75 No. 9, American Institute of Physics.

Ishizuka, H. et al., "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.

Ishizuka, H. et al., "Smith-Purcell Radiation Experiment Using a Field-Emission Array Cathode," Nuclear Instruments and Methods in Physics Research, 2000, pp. 276-280, A 445, Elsevier Science B.V.

Ives, Lawrence et al., "Development of Backward Wave Oscillators for Terahertz Applications," Terahertz for Military and Security Applications, Proceedings of SPIE vol. 5070 (2003), pp. 71-82.

Ives, R. Lawrence, "IVEC Summary, Session 2, Sources I" 2002.

Jonietz, Erika, "Nano Antenna Gold nanospheres show path to all-optical computing," Technology Review, Dec. 2005/Jan. 2006, p. 32.

Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA Nov. 1995 pp. 117-121.

Joo, Youngcheol et al., "Fabrication of Monolithic Microchannels for IC Chip Cooling," 1995, Mechanical, Aerospace and Nuclear Engineering Department, University of California at Los Angeles.

Jung, K.B. et al., "Patterning of Cu, Co, Fe, and Ag for magnetic nanostructures," J. Vac. Sci. Technol. A 15(3), May/Jun. 1997, pp. 1780-1784.

Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.

Kiener, C. et al., "Investigation of the Mean Free Path of Hot Electrons in GaAs/AlGaAs Heterostructures," Semicond. Sci. Technol., 1994, pp. 193-197, vol. 9, IOP Publishing Ltd., United Kingdom.

Kim, Shang Hoon, "Quantum Mechanical Theory of Free-Electron Two-Quantum Stark Emission Driven by Transverse Motion," Journal of the Physical Society of Japan, Aug. 1993, vol. 62 No. 8, pp. 2528-2532.

Liu, Chuan Sheng, et al., "Stimulated Coherent Smith-Purcell Radiation from a Metallic Grating," IEEE Journal of Quantum Electronics, Oct. 1999, pp. 1386-1389, vol. 35, No. 10, IEEE.

Manohara, Harish et al., "Field Emission Testing of Carbon Nanotubes for THz Frequency Vacuum Microtube Sources." Abstract. Dec. 2003. from SPIEWeb.

McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.

Meyer, Stephan, "Far IR, Sub-MM & MM Detector Technology Workshop Summary," Oct. 2002. (may date the Manohara documents).

Mokhoff, Nicolas, "Optical-speed light detector promises fast space talk," EETimes Online, Mar. 20, 2006, from website: www.eetimes.com/showArticle.jhtml?articleID=183701047.

Nguyen, Phucanh et al., "Novel technique to pattern silver using CF4 and CF4/O2 glow discharges," J.Vac. Sci. Technol. B 19(1), Jan./Feb. 2001, American Vacuum Society, pp. 158-165.

Nguyen, Phucanh et al., "Reactive ion etch of patterned and blanket silver thin films in Cl2/O2 and O2 glow discharges," J. Vac. Sci, Technol. B. 17 (5), Sep./Oct. 1999, American Vacuum Society, pp. 2204-2209.

Phototonics Research, "Surface-Plasmon-Enhanced Random Laser Demonstrated," Photonics Spectra, Feb. 2005, pp. 112-113.

Potylitsin, A.P., "Resonant Diffraction Radiation and Smith-Purcell Effect," (Abstract), arXiv: physics/9803043 v2 Apr. 13, 1998.

Potylitsyn, A.P., "Resonant Diffraction Radiation and Smith-Purcell Effect," Physics Letters A, Feb. 2, 1998, pp. 112-116, A 238, Elsevier Science B.V.

S. Hoogland et al., "A solution-processed 1.53 µm quantum dot laser with temperature-invariant emission wavelength," Optics Express, vol. 14, No. 8, Apr. 17, 2006, pp. 3273-3281.

Savilov, Andrey V., "Stimulated Wave Scattering in the Smith-Purcell FEL," IEEE Transactions on Plasma Science, Oct. 2001, pp. 820-823, vol. 29 No. 5, IEEE.

Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.

Schachter, Levi, "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.

Schachter, Levi, "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institute of Physics.

Shih, I. et al., "Experimental Investigations of Smith-Purcell Radiation," Journal of the Optical Society of America, Mar. 1990, pp. 351-356, vol. 7, No. 3, Optical Society of America.

Shih, I. et al., "Measurements of Smith-Purcell Radiation," Journal of the Optical Society of America, Mar. 1990, pp. 345-350, vol. 7 No. 3, Optical Society of America.

Swartz, J.C. et al., "THz-FIR Grating Coupled Radiation Source," Plasma Science, 1998. 1D02, p. 126.

Temkin, Richard, "Scanning with Ease Through the Far Infrared," Science, New Series, May 8, 1998, p. 854, vol. 280, No. 5365, American Association for the Advancement of Science.

Walsh, J.E., et al., 1999. From website: http://www.ieee.org/organizations/pubs/newsletters/leos/feb99/hot2.htm.

Wentworth, Stuart M. et al., "Far-Infrared Composite Microbolometers," IEEE MTT-S Digest, 1990, pp. 1309-1310.

Yamamoto, N. et al., "Photon Emission From Silver Particles Induced by a High-Energy Electron Beam," Physical Review B, Nov. 6, 2001, pp. 205419-1-205419-9, vol. 64, The American Physical Society.

Yokoo, K. et al., "Smith-Purcell Radiation at Optical Wavelength Using a Field-Emitter Array," Technical Digest of IVMC, 2003, pp. 77-78.

Zeng, Yuxiao et al., "Processing and encapsulation of silver patterns by using reactive ion etch and ammonia anneal," Materials Chemistry and Physics 66, 2000, pp. 77-82.

Search Report and Written Opinion mailed Aug. 24, 2007 in PCT Appln. No. PCT/US2006/022768.

Search Report and Written Opinion mailed Aug. 31, 2007 in PCT Appln. No. PCT/US2006/022680.

Search Report and Written Opinion mailed Jul. 16, 2007 in PCT Appln. No. PCT/US2006/022774.

Search Report and Written Opinion mailed Jul. 20, 2007 in PCT Appln. No. PCT/US2006/024216.

Search Report and Written Opinion mailed Jul. 26, 2007 in PCT Appln. No. PCT/US2006/022776.

Search Report and Written Opinion mailed Jun. 20, 2007 in PCT Appln. No. PCT/US2006/022779.

Search Report and Written Opinion mailed Sep. 12, 2007 in PCT Appln. No. PCT/US2006/022767.

Search Report and Written Opinion mailed Sep. 13, 2007 in PCT Appln. No. PCT/US2006/024217.

Search Report and Written Opinion mailed Sep. 17, 2007 in PCT Appln. No. PCT/US2006/022787.

Search Report and Written Opinion mailed Sep. 5, 2007 in PCT Appln. No. PCT/US2006/027428.

Search Report and Written Opinion mailed Sep. 17, 2007 in PCT Appln. No. PCT/US2006/022689.

International Search Report and Written Opinion mailed Nov. 23, 2007 in International Application No. PCT/US2006/022786.

Search Report and Written Opinion mailed Oct. 25, 2007 in PCT Appln. No. PCT/US2006/022687.

Search Report and Written Opinion mailed Oct. 26, 2007 in PCT Appln. No. PCT/US2006/022675.

Search Report and Written Opinion mailed Sep. 21, 2007 in PCT Appln. No. PCT/US2006/022688.

Search Report and Written Opinion mailed Sep. 25, 2007 in PCT appln. No. PCT/US2006/022681.

Search Report and Written Opinion mailed Sep. 26, 2007 in PCT Appln. No. PCT/US2006/024218.

"An Early History—Invention of the Klystron," http://varianinc.com/cgi-bin/advprint/print.cgi?cid=KLQNPPJJFJ, printed on Dec. 26, 2008.

"An Early History—The Founding of Varian Associates," http://varianinc.com/cgi-bin/advprint/print.cgi?cid=KLQNPPJJFJ, printed on Dec. 26, 2008.

"Chapter 3 E-Ray Tube," http://compepid.tuskegee.edu/syllabi/clinical/small/radiology/chapter..., printed from tuskegee.edu on Dec. 29, 2008.

"Diagnostic imaging modalities—Ionizing vs non-ionizing radiation," http://info.med.yale.edu/intmed/cardio/imaging/techniques/ionizing_v..., printed from Yale University School of Medicine on Dec. 29, 2008.

"Frequently Asked Questions," Luxtera Inc., found at http://www.luxtera.com/technology_faq.htm, printed on Dec. 2, 2005, 4 pages.

"Klystron Amplifier," http://www.radartutorial.eu/08.transmitters/tx12.en.html, printed on Dec. 26, 2008.

"Klystron is a Micowave Generator," http://www2.slac.stanford.edu/vvc/accelerators/klystron.html, printed on Dec. 26, 2008.

"Klystron," http:en.wikipedia.org/wiki/Klystron, printed on Dec. 26, 2008.

"Making E-rays," http://www.fnrfscience.cmu.ac.th/theory/radiation/xray-basics.html, printed on Dec. 29, 2008.

"Microwave Tubes," http://www.tpub.com/neets/book11/45b.htm, printed on Dec. 26, 2008.

"Technology Overview," Luxtera, Inc., found at http://www.luxtera.com/technology.htm, printed on Dec. 2, 2005, 1 page.

"The Reflex Klystron," http://www.fnrfscience.cmu.ac.th/theory/microwave/microwave%2, printed from Fast Netoron Research Facility on Dec. 26, 2008.

"X-ray tube," http://www.answers.com/topic/x-ray-tube, printed on Dec. 29, 2008.

Corcoran, Elizabeth, "Ride the Light," Forbes Magazine, Apr. 11, 2005, pp. 68-70.

Ossia, Babak, "The X-Ray Production," Department of Biomedical Engineering—University of Rhode Island, 1 page.

Sadwick, Larry et al., "Microfabricated next-generation millimeter-wave power amplifiers," www.rfdesign.com.

Saraph, Girish P. et al., "Design of a Single-Stage Depressed Collector for High-Power, Pulsed Gyroklystrom Amplifiers," IEEE Transactions on Electron Devices, vol. 45, No. 4, Apr. 1998, pp. 986-990.

Sartori, Gabriele, "CMOS Photonics Platform," Luxtera, Inc., Nov. 2005, 19 pages.

Search Report and Written Opinion mailed Apr. 23, 2008 in PCT Appln. No. PCT/US2006/022678.

Search Report and Written Opinion mailed Apr. 3, 2008 in PCT Appln. No. PCT/US2006/027429.

Search Report and Written Opinion mailed Jun. 18, 2008 in PCT Appln. No. PCT/US2006/027430.

Search Report and Written Opinion mailed Jun. 3, 2008 in PCT Appln. No. PCT/US2006/022783.

Search Report and Written Opinion mailed Mar. 24, 2008 in PCT Appln. No. PCT/US2006/022677.

Search Report and Written Opinion mailed Mar. 24, 2008 in PCT Appln. No. PCT/US2006/022784.

Search Report and Written Opinion mailed May 2, 2008 in PCT Appln. No. PCT/US2006/023280.

Search Report and Written Opinion mailed May 21, 2008 in PCT Appln. No. PCT/US2006/023279.

Search Report and Written Opinion mailed May 22, 2008 in PCT Appln. No. PCT/US2006/022685.

Thumm, Manfred, "Historical German Contributions to Physics and Applications of Electromagnetic Oscillations and Waves."

Whiteside, Andy et al., "Dramatic Power Savings using Depressed Collector IOT Transmitters in Digital and Analog Service."

"Notice of Allowability" mailed on Jan. 17, 2008 in U.S. Appl. No. 11/418,082, filed May 5, 2006.

Mar. 24, 2006 PTO Office Action in U.S. Appl. No. 10/917,511.

Mar. 25, 2008 PTO Office Action in U.S. Appl. No. 11/411,131.

Apr. 8, 2008 PTO Office Action in U.S. Appl. No. 11/325,571.

Apr. 17, 2008 Response to PTO Office Action of Dec. 20, 2007 in U.S. Appl. No. 11/418,087.

Apr. 19, 2007 Response to PTO Office Action of Jan. 17, 2007 in U.S. Appl. No. 11/418,082.

May 10, 2005 PTO Office Action in U.S. Appl. No. 10/917,511.

May 21, 2007 PTO Office Action in U.S. Appl. No. 11/418,087.

May 26, 2006 Response to PTO Office Action of Mar. 24, 2006 in U.S. Appl. No. 10/917,511.

Jun. 16, 2008 Response to PTO Office Action of Dec. 14, 2007 in U.S. Appl. No. 11/418,264.

Jun. 20, 2008 Response to PTO Office Action of Mar. 25, 2008 in U.S. Appl. No. 11/411,131.

Aug. 14, 2006 PTO Office Action in U.S. Appl. No. 10/917,511.

Sep. 1, 2006 Response to PTO Office Action of Aug. 14, 2006 in U.S. Appl. No. 10/917,511.

Sep. 12, 2005 Response to PTO Office Action of May 10, 2005 in U.S. Appl. No. 10/917,511.

Sep. 14, 2007 PTO Office Action in U.S. Appl. No. 11/411,131.

Oct. 19, 2007 Response to PTO Office Action of May 21, 2007 in U.S. Appl. No. 11/418,087.

Dec. 4, 2006 PTO Office Action in U.S. Appl. No. 11/418,087.

Dec. 14, 2007 PTO Office Action in U.S. Appl. No. 11/418,264.

Dec. 14, 2007 Response to PTO Office Action of Sep. 14, 2007 in U.S. Appl. No. 11/411,131.

Dec. 20, 2007 PTO Office Action in U.S. Appl. No. 11/418,087.

European Search Report mailed Mar. 3, 2009 in European Application No. 06852028.7.

U.S. Appl. No. 11/203,407—Nov. 13, 2008 PTO Office Action.

U.S. Appl. No. 11/238,991—Dec. 6, 2006 PTO Office Action.

U.S. Appl. No. 11/238,991—Jun. 6, 2007 Response to PTO Office Action of Dec. 6, 2006.

U.S. Appl. No. 11/238,991—Sep. 10, 2007 PTO Office Action.

U.S. Appl. No. 11/238,991—Mar. 6, 2008 Response to PTO Office Action of Sep. 10, 2007.

U.S. Appl. No. 11/238,991—Jun. 27, 2008 PTO Office Action.

U.S. Appl. No. 11/238,991—Dec. 29, 2008 Response to PTO Office Action of Jun. 27, 2008.

U.S. Appl. No. 11/238,991—Mar. 24, 2009 PTO Office Action.

U.S. Appl. No. 11/243,477—Apr. 25, 2008 PTO Office Action.

U.S. Appl. No. 11/243,477—Oct. 24, 2008 Response to PTO Office Action of Apr. 25, 2008.

U.S. Appl. No. 11/243,477—Jan. 7, 2009 PTO Office Action.

U.S. Appl. No. 11/325,448—Jun. 16, 2008 PTO Office Action.

U.S. Appl. No. 11/325,448—Dec. 16, 2008 Response to PTO Office Action of Jun. 16, 2008.

U.S. Appl. No. 11/325,534—Jun. 11, 2008 PTO Office Action.

U.S. Appl. No. 11/325,534—Oct. 15, 2008 Response to PTO Office Action of Jun. 11, 2008.

U.S. Appl. No. 11/353,208—Jan. 15, 2008 PTO Office Action.

U.S. Appl. No. 11/353,208—Mar. 17, 2008 PTO Office Action.

U.S. Appl. No. 11/353,208—Sep. 15, 2008 Response to PTO Office Action of Mar. 17, 2008.

U.S. Appl. No. 11/353,208—Dec. 24, 2008 PTO Office Action.

U.S. Appl. No. 11/353,208—Dec. 30, 2008 Response to PTO Office Action of Dec. 24, 2008.

U.S. Appl. No. 11/400,280—Oct. 16, 2008 PTO Office Action.

U.S. Appl. No. 11/400,280—Oct. 24, 2008 Response to PTO Office Action of Oct. 16, 2008.

U.S. Appl. No. 11/410,905—Sep. 26, 2008 PTO Office Action.

U.S. Appl. No. 11/410,905—Mar. 26, 2009 Response to PTO Office Action of Sep. 26, 2008.

U.S. Appl. No. 11/410,924—Mar. 6, 2009 PTO Office Action.

U.S. Appl. No. 11/411,120—Mar. 19, 2009 PTO Office Action.

U.S. Appl. No. 11/411,129—Jan. 16, 2009 Office Action.

U.S. Appl. No. 11/411,130—May 1, 2008 PTO Office Action.

U.S. Appl. No. 11/411,130—Oct. 29, 2008 Response to PTO Office Action of May 1, 2008.

U.S. Appl. No. 11/417,129—Jul. 11, 2007 PTO Office Action.

U.S. Appl. No. 11/417,129—Dec. 17, 2007 Response to PTO Office Action of Jul. 11, 2007.

U.S. Appl. No. 11/417,129—Dec. 20, 2007 Response to PTO Office Action of Jul. 11, 2007.

U.S. Appl. No. 11/417,129—Apr. 17, 2008 PTO Office Action.

U.S. Appl. No. 11/417,129—Jun. 19, 2008 Response to PTO Office Action of Apr. 17, 2008.

U.S. Appl. No. 11/418,079—Apr. 11, 2008 PTO Office Action.

U.S. Appl. No. 11/418,079—Oct. 7, 2008 Response to PTO Office Action of Apr. 11, 2008.

U.S. Appl. No. 11/418,079—Feb. 12, 2009 PTO Office Action.

U.S. Appl. No. 11/418,080—Mar. 18, 2009 PTO Office Action.

U.S. Appl. No. 11/418,082—Jan. 17, 2007 PTO Office Action.

U.S. Appl. No. 11/418,084—Nov. 5, 2007 PTO Office Action.
U.S. Appl. No. 11/418,084—May 5, 2008 Response to PTO Office Action of Nov. 5, 2007.
U.S. Appl. No. 11/418,084—Aug. 19, 2008 PTO Office Action.
U.S. Appl. No. 11/418,084—Feb. 19, 2009 Response to PTO Office Action of Aug. 19, 2008.
U.S. Appl. No. 11/418,085—Aug. 10, 2007 PTO Office Action.
U.S. Appl. No. 11/418,085—Nov. 13, 2007 Response to PTO Office Action of Aug. 10, 2007.
U.S. Appl. No. 11/418,085—Feb. 12, 2008 PTO Office Action.
U.S. Appl. No. 11/418,085—Aug. 12, 2008 Response to PTO Office Action of Feb. 12, 2008.
U.S. Appl. No. 11/418,085—Sep. 16, 2008 PTO Office Action.
U.S. Appl. No. 11/418,085—Mar. 6, 2009 Response to PTO Office Action of Sep. 16, 2008.
U.S. Appl. No. 11/418,087—Dec. 29, 2006 Response to PTO Office Action of Dec. 4, 2006.
U.S. Appl. No. 11/418,087—Feb. 15, 2007 PTO Office Action.
U.S. Appl. No. 11/418,087—Mar. 6, 2007 Response to PTO Office Action of Feb. 15, 2007.
U.S. Appl. No. 11/418,088—Jun. 9, 2008 PTO Office Action.
U.S. Appl. No. 11/418,088—Dec. 8, 2008 Response to PTO Office Action of Jun. 9, 2008.
U.S. Appl. No. 11/418,089—Mar. 21, 2008 PTO Office Action.
U.S. Appl. No. 11/418,089—Jun. 23, 2008 Response to PTO Office Action of Mar. 21, 2008.
U.S. Appl. No. 11/418,089—Sep. 30, 2008 PTO Office Action.
U.S. Appl. No. 11/418,089—Sep. 30, 2009 Response to PTO Office Action of Sep. 30, 2008.
U.S. Appl. No. 11/418,091—Jul. 30, 2007 PTO Office Action.
U.S. Appl. No. 11/418,091—Nov. 27, 2007 Response to PTO Office Action of Jul. 30, 2007.
U.S. Appl. No. 11/418,091—Feb. 26, 2008 PTO Office Action.
U.S. Appl. No. 11/418,097—Jun. 2, 2008 PTO Office Action.
U.S. Appl. No. 11/418,097—Dec. 2, 2008 Response to PTO Office Action of Jun. 2, 2008.
U.S. Appl. No. 11/418,097—Feb. 18, 2009 PTO Office Action.
U.S. Appl. No. 11/418,099—Jun. 23, 2008 PTO Office Action.
U.S. Appl. No. 11/418,099—Dec. 23, 2008 Response to PTO Office Action of Jun. 23, 2008.
U.S. Appl. No. 11/418,100—Jan. 12, 2009 PTO Office Action.
U.S. Appl. No. 11/418,123—Apr. 25, 2008 PTO Office Action.
U.S. Appl. No. 11/418,123—Oct. 27, 2008 Response to PTO Office Action of Apr. 25, 2008.
U.S. Appl. No. 11/418,123—Jan. 26, 2009 PTO Office Action.
U.S. Appl. No. 11/418,124—Oct. 1, 2008 PTO Office Action.
U.S. Appl. No. 11/418,124—Feb. 2, 2009 Response to PTO Office Action of Oct. 1, 2008.
U.S. Appl. No. 11/418,124—Mar. 13, 2009 PTO Office Action.
U.S. Appl. No. 11/418,126—Oct. 12, 2006 PTO Office Action.
U.S. Appl. No. 11/418,126—Feb. 12, 2007 Response to PTO Office Action of Oct. 12, 2006 (Redacted).
U.S. Appl. No. 11/418,126—Jun. 6, 2007 PTO Office Action.
U.S. Appl. No. 11/418,126—Aug. 6, 2007 Response to PTO Office Action of Jun. 6, 2007.
U.S. Appl. No. 11/418,126—Nov. 2, 2007 PTO Office Action.
U.S. Appl. No. 11/418,126—Feb. 22, 2008 Response to PTO Office Action of Nov. 2, 2007.
U.S. Appl. No. 11/418,126—Jun. 10, 2008 PTO Office Action.
U.S. Appl. No. 11/418,127—Apr. 2, 2009 Office Action.
U.S. Appl. No. 11/418,128—Dec. 16, 2008 PTO Office Action.
U.S. Appl. No. 11/418,128—Dec. 31, 2008 Response to PTO Office Action of Dec. 16, 2008.
U.S. Appl. No. 11/418,128—Feb. 17, 2009 PTO Office Action.
U.S. Appl. No. 11/418,129—Dec. 16, 2008 Office Action.
U.S. Appl. No. 11/418,129—Dec. 31, 2008 Response to PTO Office Action of Dec. 16, 2008.
U.S. Appl. No. 11/418,244—Jul. 1, 2008 PTO Office Action.
U.S. Appl. No. 11/418,244—Nov. 25, 2008 Response to PTO Office Action of Jul. 1, 2008.
U.S. Appl. No. 11/418,263—Sep. 24, 2008 PTO Office Action.
U.S. Appl. No. 11/418,263—Dec. 24, 2008 Response to PTO Office Action of Sep. 24, 2008.
U.S. Appl. No. 11/418,263—Mar. 9, 2009 PTO Office Action.
U.S. Appl. No. 11/418,315—Mar. 31, 2008 PTO Office Action.
U.S. Appl. No. 11/418,318—Mar. 31, 2009 PTO Office Action.
U.S. Appl. No. 11/441,219—Jan. 7, 2009 PTO Office Action.
U.S. Appl. No. 11/522,929—Oct. 22, 2007 PTO Office Action.
U.S. Appl. No. 11/522,929—Feb. 21, 2008 Response to PTO Office Action of Oct. 22, 2007.
U.S. Appl. No. 11/641,678—Jul. 22, 2008 PTO Office Action.
U.S. Appl. No. 11/641,678—Jan. 22, 2009 Response to Office Action of Jul. 22, 2008.
U.S. Appl. No. 11/711,000—Mar. 6, 2009 PTO Office Action.
U.S. Appl. No. 11/716,552—Feb. 12, 2009 Response to PTO Office Action of Feb. 9, 2009.
U.S. Appl. No. 11/716,552—Jul. 3, 2008 PTO Office Action.
"Notice of Allowability" mailed on Jul. 2, 2009 in U.S. Appl. No. 11/410,905, filed Apr. 26, 2006.
"Notice of Allowability" mailed on Jun. 30, 2009 in U.S. Appl. No. 11/418,084, filed May 5, 2006.
B. B Loechel et al., "Fabrication of Magnetic Microstructures by Using Thick Layer Resists", Microelectronics Eng., vol. 21, pp. 463-466 (1993).
Magellan 8500 Scanner Product Reference Guide, PSC Inc., 2004, pp. 6-27-F18.
Magellan 9500 with SmartSentry Quick Reference Guide, PSC Inc., 2004.
Response to Non-Final Office Action submitted May 13, 2009 in U.S. Appl. No. 11/203,407.
U.S. Appl. No. 11/238,991—May 11, 2009 PTO Office Action.
U.S. Appl. No. 11/350,812—Apr. 17, 2009 Office Action.
U.S. Appl. No. 11/411,130—Jun. 23, 2009 PTO Office Action.
U.S. Appl. No. 11/418,089—Jul. 15, 2009 PTO Office Action.
U.S. Appl. No. 11/418,096—Jun. 23, 2009 PTO Office Action.
U.S. Appl. No. 11/433,486—Jun. 19, 2009 PTO Office Action.
Brau et al., "Tribute to John E Walsh", Nuclear Instruments and Methods in Physics Research Section A. Accelerators, Spectrometers, Detectors and Associated Equipment, vol. 475, Issues 1-3, Dec. 21, 2001, pp. xiii-xiv.
Kapp, et al., "Modification of a scanning electron microscope to produce Smith-Purcell radiation", Rev. Sci. Instrum. 75, 4732 (2004).
Scherer et al. "Photonic Crystals for Confining, Guiding, and Emitting Light", IEEE Transactions on Nanotechnology, vol. 1, No. 1, Mar. 2002, pp. 4-11.
U.S. Appl. No. 11/203,407—Jul. 17, 2009 PTO Office Action.
U.S. Appl. No. 11/418,097—Sep. 16, 2009 PTO Office Action.
U.S. Appl. No. 11/418,123—Aug. 11, 2009 PTO Office Action.
U.S. Appl. No. 11/418,365—Jul. 23, 2009 PTO Office Action.
U.S. Appl. No. 11/441,240—Aug. 31, 2009 PTO Office Action.
Urata et al., "Superradiant Smith-Purcell Emission", Phys. Rev. Lett. 80, 516-519 (1998).
Neo et al., "Smith-Purcell Radiation from Ultraviolet to Infrared Using a Si-field Emitter" Vacuum Electronics Conference, 2007, IVEC '07, IEEE International May 2007.
Search Report and Writen Opinion mailed Jul. 14, 2008 in PCT Appln. No. PCT/US2006/022773.
Search Report and Written Opinion mailed Aug. 19, 2008 in PCT Appln. No. PCT/US2007/008363.
Search Report and Written Opinion mailed Jul. 16, 2008 in PCT Appln. No. PCT/US2006/022766.
Search Report and Written Opinion mailed Jul. 28, 2008 in PCT Appln. No. PCT/US2006/022782.
Search Report and Written Opinion mailed Jul. 3, 2008 in PCT Appln. No. PCT/US2006/022690.
Search Report and Written Opinion mailed Jul. 3, 2008 in PCT Appln. No. PCT/US2006/022778.
Search Report and Written Opinion mailed Jul. 7, 2008 in PCT Appln. No. PCT/US2006/022686.
Search Report and Written Opinion mailed Jul. 7, 2008 in PCT Appln. No. PCT/US2006/022785.
Search Report and Written Opinion mailed Sep. 2, 2008 in PCT Appln. No. PCT/US2006/022769.
Search Report and Written Opinion mailed Sep. 26, 2008 in PCT Appln. No. PCT/US2007/00053.

Search Report and Written Opinion mailed Sep. 3, 2008 in PCT Appln. No. PCT/US2006/022770.

Bekefi et al., "Stimulated Raman Scattering by an Intense Relativistic Electron Beam Subjected to a Rippled Electron Field", Aug. 1979, J. Appl. Phys., 50(8), 5168-5164.

European Search Report mailed Nov. 2, 2009 (related to PCT/US2006/022782).

Gervasoni J.L. et al., "Plasmon Excitations in Cylindrical Wires by External Charged Particles," Physical Review B (Condensed Matter and Materials Physics) APS through AIP USA, vol. 68, No. 23, Dec. 15, 2003, pp. 235302-1, XP002548423, ISSN: 0163-1829.

Gervasoni, J.L., "Excitations of Bulk and Surface Plasmons in Solids and Nanostructures," Surface and Interface Analysis, Apr. 2006, John Wiley and Sons Ltd GB, vol. 38, No. 4, Apr. 2006, pp. 583-586, XP002548422.

Rich, Alan, "Shielding and Guarding, How to Exclude Interference-type noise," Analog Dialogue 17-1, 1983.

U.S. Appl. No. 11/411,129 - Jan. 28, 2010 PTO Office Action.
U.S. Appl. No. 11/418,079 - Jan. 7, 2010 PTO Office Action.
U.S. Appl. No. 11/418,080 - Jan. 5, 2010 PTO Office Action.
U.S. Appl. No. 11/418,128 - Nov. 24, 2009 PTO Office Action.
U.S. Appl. No. 11/418,263 - Jan. 5, 2009 PTO Office Action.

* cited by examiner

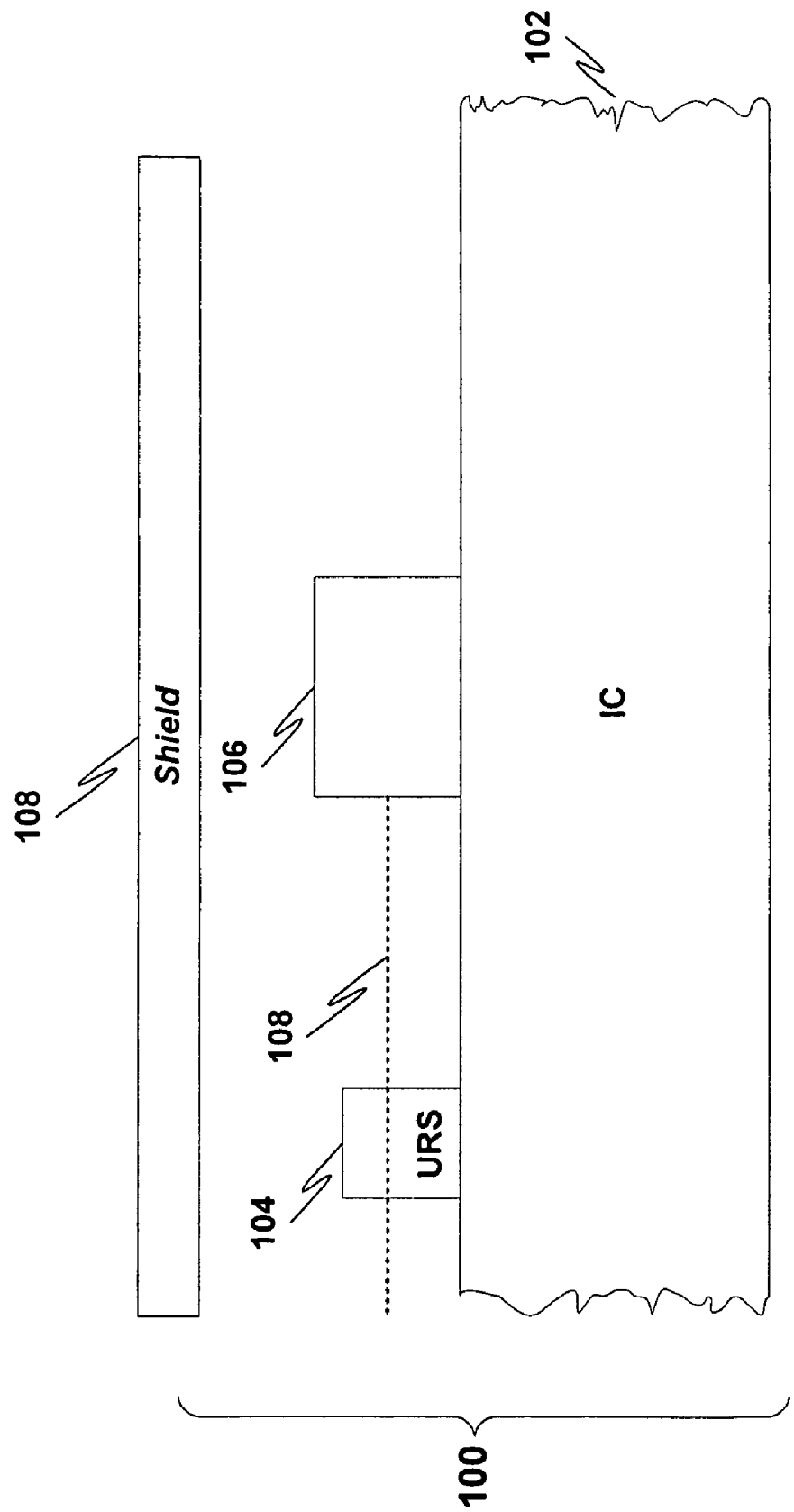

SHIELDING OF INTEGRATED CIRCUIT PACKAGE WITH HIGH-PERMEABILITY MAGNETIC MATERIAL

COPYRIGHT NOTICE

A portion of the disclosure of this patent document contains material which is subject to copyright or mask work protection. The copyright or mask work owner has no objection to the facsimile reproduction by anyone of the patent document or the patent disclosure, as it appears in the Patent and Trademark Office patent file or records, but otherwise reserves all copyright or mask work rights whatsoever.

CROSS-REFERENCE TO RELATED APPLICATIONS

The present invention is related to the following co-pending U.S. patent applications which are all commonly owned with the present application, the entire contents of each of which are incorporated herein by reference:
(1) U.S. patent application Ser. No. 11/238,991, filed Sep. 30, 2005, entitled "Ultra-Small Resonating Charged Particle Beam Modulator";
(2) U.S. patent application Ser. No. 10/917,511, filed on Aug. 13, 2004, entitled "Patterning Thin Metal Film by Dry Reactive Ion Etching";
(3) U.S. application Ser. No. 11/203,407, filed on Aug. 15, 2005, entitled "Method Of Patterning Ultra-Small Structures";
(4) U.S. application Ser. No. 11/243,476, filed on Oct. 5, 2005, entitled "Structures And Methods For Coupling Energy From An Electromagnetic Wave";
(5) U.S. application Ser. No. 11/243,477, filed on Oct. 5, 2005, entitled "Electron beam induced resonance";
(6) U.S. application Ser. No. 11/325,448, entitled "Selectable Frequency Light Emitter from Single Metal Layer," filed Jan. 5, 2006;
(7) U.S. application Ser. No. 11/325,432, entitled, "Matrix Array Display," filed Jan. 5, 2006;
(8) U.S. application Ser. No. 11/410,924, entitled, "Selectable Frequency EMR Emitter," filed Apr. 26, 2006;
(9) U.S. application Ser. No. 11/418,126, entitled, "Multiplexed Optical Communication between Chips on A Multi-Chip Module," filed on even date herewith;
(10) U.S. patent application Ser. No. 11/400,280, titled "Micro Resonant Detector for Optical Signals on a Chip," filed Apr. 10, 2006.

FIELD OF THE DISCLOSURE

This relates to ultra-small electronic devices, and, more particularly, shielding such devices within integrated circuits.

BACKGROUND & INTRODUCTION

The related applications describe various ultra-small resonant structures (URSs) and devices formed therefrom. As described in the related applications, the ultra-small resonant structures may emit electromagnetic radiation (EMR) at a wide range of frequencies (e.g., visible light), and often at a frequency higher than that of microwave. EMR is emitted from the a resonant structure when the resonant structure is exposed to a beam of charged particles ejected from or emitted by a source of charged particles. The source may be controlled, e.g., by applying a signal on data input. The source can be any desired source of charged particles such as an ion gun, a thermionic filament, tungsten filament, a cathode, a vacuum triode, a planar vacuum triode, an electron-impact ionizer, a laser ionizer, a field emission cathode, a chemical ionizer, a thermal ionizer, an ion-impact ionizer, an electron source from a scanning electron microscope, etc. The particles may be positive ions, negative ions, electrons, and protons and the like.

The ultra-small resonant structures may be formed in or on integrated circuits (ICs), multi-chip modules (MCMs) or the like.

As described in the related applications, the ultra-small resonant structures are preferably under vacuum conditions during operation. Vacuum conditions prevent, to some degree, interaction of charged particle beams with stray atomic particles. Accordingly, entire integrated packages/circuits (which includes the IC and ultra-small resonant structures) may be vacuum packaged. Alternatively, a portion of a package containing at least the ultra-small resonant structure (s) should be vacuum packaged. Known hermetic sealing techniques can be employed to ensure the vacuum condition remains during a reasonable lifespan of operation.

However, while vacuum conditions provide some protection from stray particles, there may be other sources of interference with the charged particle beams. These other sources include, e.g., stray electric, magnetic and/or electromagnetic fields. Accordingly, it is desirable to shield the structures from stray electric, magnetic and/or electromagnetic fields.

BRIEF DESCRIPTION OF THE DRAWINGS

The following description, given with respect to the attached drawing, may be better understood with reference to the non-limiting examples of the drawing, wherein the FIGURE shows a shielded IC package.

THE PRESENTLY PREFERRED EXEMPLARY EMBODIMENTS

The FIGURE shows an integrated structure 100 in which IC 102 is integrated with an ultra-small resonant structure (URS) 104. The IC may be any IC formed, e.g., with conventional semiconductor processing. The ultra-small resonant structure(s) may be any ultra-small resonant structure(s). Exemplary ultra-small resonant structures are described in the various related applications which have been incorporated herein by reference. Although only one ultra-small resonant structure, those skilled in the art will realize and understand, upon reading this description, that many such structures may be provided.

As noted above, the ultra-small resonant structure(s) use a charged particle beam (e.g., an electron beam) to create and/or detect EMR, including in the optical frequency ranges.

A source 106 of charged particles 108 is also provided. The source 106 may be formed on the same IC as the URS 104, or it may be located elsewhere (e.g., on another chip or IC).

Shielding 110 is provided to prevent interference with the charged particle beam 108 from other sources such as, stray electric, magnetic and/or electromagnetic fields. The shielding 110 may be formed around the entire IC or to protect only parts thereof.

Preferably the shielding 110 is formed from a high-permeability magnetic material, e.g., non-conductive magnetic oxides such as the ferrites $MnFe_2O_4$, $FeFe_2O_4$, $CoFe_2O_4$, $NiFe_2O_4$, $CuFe_2O_4$, and/or $MgFe_2O_4$. Cobaltites, chromites, manganites and other materials. Commercially-available shielding materials, e.g., ferromagnetic shielding materials generally, specific shielding materials sold under the trade names MUMETAL, PERMALLOY, etc., and others may also be used.

MuMetal is a nickel-iron alloy (composed of 77% nickel, 15% iron, plus copper and molybdenum) that has a high magnetic permeability and that is highly effective for shielding magnetic fields. MuMetal is one trade name for a high-permeability, magnetically "soft" alloy. Other trade names include Hipernom, HyMu-80 and Permalloy.

High permeability makes mumetal effective at screening static or low-frequency magnetic fields, which cannot generally be attenuated by other methods. (See, e.g., "Shielding and Guarding, How to Exclude Interference-Type Noise, What to do and why to do it—A Rational Approach," Alan Rich, Analog Devices, Application Note AN-347, *Analog Dialog* 1983, the entire contents of which are incorporated herein by reference.)

Both conductive and non-conductive shielding materials may be used, depending e.g., on proximity to integrated circuit packages or other electronics in the device.

Depending on the type of shielding, it may be applied by incorporating it into other supporting material, and/or it may be applied (e.g., by spraying or sputtering) onto an IC assembly.

Magnetic shielding may also be used within, e.g., integrated circuit packages, MCM packages and the like.

Those skilled in the art will realize and understand, upon reading this description, that different and/or other materials with similar magnetic properties may be used, e.g., supermalloy, supermumetal, nilomag, sanbold, Mo-Permalloy, Ultraperm, M-1040, and the like.

The ultra-small resonant structures may be made, e.g., using techniques such as described in U.S. patent application Ser. No. 10/917,511, entitled "Patterning Thin Metal Film by Dry Reactive Ion Etching" and/or U.S. application Ser. No. 11/203,407, entitled "Method Of Patterning Ultra-Small Structures," both of which have been incorporated herein by reference.

The ultra-small resonant structure may comprise any number of resonant microstructures constructed and adapted to produce EMR, e.g., as described above and/or in any of the related applications, including U.S. application Ser. Nos. 11/325,448; 11/325,432; 11/243,476; 11/243,477; 11/302, 471; 11/400,280; and 11/410,924, each of which is described in greater detail above in the Section headed "Cross-Reference To Related Applications," and each of which is fully incorporated herein by reference.

While certain configurations of structures have been illustrated for the purposes of presenting the basic structures of the present invention, one of ordinary skill in the art will appreciate that other variations are possible which would still fall within the scope of the appended claims. While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

I claim:

1. A method of making a device comprising:
    forming an ultra-small resonant structure constructed and adapted to emit electromagnetic radiation (EMR) in response to excitation by a beam of charged particles; and
    shielding at least a portion of said ultra-small resonant structure with a high-permeability magnetic material.

2. A method as in claim 1 wherein said magnetic material is formed from a substance selected from a non-conductive magnetic oxide.

3. A method as in claim 2 wherein the non-conductive magnetic oxide is selected from the group comprising: a ferrite; a cobaltite, a chromite, and a manganite.

4. A method as in claim 3 wherein the ferrite is selected from the group comprising: $MnFe_2O_4$, $FeFe_2O_4$, $CoFe_2O_4$, $NiFe_2O_4$, $CuFe_2O_4$, and $MgFe_2O_4$.

5. A method as in claim 1 wherein the magnetic material comprises a metal selected from the group comprising: mumetal, permalloy, Hipernom, HyMu-80, supermalloy, supermumetal, nilomag, sanbold, Mo-Permalloy, Ultraperm, and M-1040.

6. A method as in any one of claims 1-5 wherein said ultra-small resonant structure includes a source of charged particles.

7. A method as in claim 6 wherein said source of charged particles is selected from the group comprising:
    an ion gun, a thermionic filament, tungsten filament, a cathode, a vacuum triode, a field emission cathode, a planar vacuum triode, an electron-impact ionizer, a laser ionizer, a chemical ionizer, a thermal ionizer, an ion-impact ionizer.

8. A method as in claim 6 wherein the charged particles are selected from the group comprising: positive ions, negative ions, electrons, and protons.

9. A method as in claim 1 wherein the ultra-small resonant structure is constructed and adapted to emit at least one of visible light, infrared light, and ultraviolet light.

10. A method as in claim 1 wherein the ultra-small resonant structure is formed on a surface of an integrated circuit (IC).

11. A method as in claim 10 further comprising:
    electrically connecting said ultra-small resonant structure to said IC.

12. A method as in claim 1 further comprising:
    vacuum packaging at least said ultra-small resonant structure.

13. A device comprising:
    at least one ultra-small resonant structure constructed and adapted to emit electromagnetic radiation (EMR) in response to excitation by a beam of charged particles; and
    shielding constructed and adapted to shield at least a portion of said ultra-small resonant structure with a high-permeability magnetic material.

14. A device as in claim 13 wherein said magnetic material is formed from a substance selected from a non-conductive magnetic oxide.

15. A device as in claim 14 wherein the non-conductive magnetic oxide is selected from the group comprising: a ferrite; a cobaltite, a chromite, and a manganite.

16. A device as in claim 15 wherein the ferrite is selected from the group comprising: $MnFe_2O_4$, $FeFe_2O_4$, $CoFe_2O_4$, $NiFe_2O_4$, $CuFe_2O_4$, and $MgFe_2O_4$.

17. A device as in claim 13 wherein the magnetic material comprises a metal selected from the group comprising: mumetal, permalloy, Hipernom, HyMu-80, supermalloy, supermumetal, nilomag, sanbold, Mo-Permalloy, Ultraperm, and M-1040.

18. A device as in any one of claims 13-17 wherein said ultra-small resonant structure includes a source of charged particles.

19. A device as in claim 18 wherein said source of charged particles is selected from the group comprising:
    an ion gun, a thermionic filament, tungsten filament, a cathode, a vacuum triode, a field emission cathode, a planar vacuum triode, an electron-impact ionizer, a laser ionizer, a chemical ionizer, a thermal ionizer, an ion-impact ionizer.

20. A device as in claim 19 wherein the charged particles are selected from the group comprising: positive ions, negative ions, electrons, and protons.

21. A device as in claim 13 wherein the ultra-small resonant structure is constructed and adapted to emit at least one of visible light, infrared light, and ultraviolet light.

22. A device as in claim 13 wherein the ultra-small resonant structure is formed on a surface of an integrated circuit (IC).

23. A device as in claim 22 wherein the ultra-small resonant structure is electrically connected to said IC.

24. A device as in claim 13 wherein at least said ultra-small resonant structure is vacuum packaged.

25. A method of making a device comprising:
forming an ultra-small resonant structure constructed and adapted to detect electromagnetic radiation (EMR); and
shielding at least a portion of said ultra-small resonant structure with a high-permeability magnetic material.

26. A method as in claim 25 wherein said magnetic material is formed from a substance selected from a non-conductive magnetic oxide.

27. A method as in claim 26 wherein the non-conductive magnetic oxide is selected from the group comprising: a ferrite; a cobaltite, a chromite, and a manganite.

28. A method as in claim 27 wherein the ferrite is selected from the group comprising: $MnFe_2O_4$, $FeFe_2O_4$, $CoFe_2O_4$, $NiFe_2O_4$, $CuFe_2O_4$, and $MgFe_2O_4$.

29. A method as in claim 25 wherein the magnetic material comprises a metal selected from the group comprising: mumetal, permalloy, Hipernom, HyMu-80, supermalloy, supermumetal, nilomag, sanbold, Mo-Permalloy, Ultraperm, and M-1040.

30. A method as in any one of claims 25-29 wherein said ultra-small resonant structure includes a source of charged particles.

31. A method as in claim 30 wherein said source of charged particles is selected from the group comprising:
an ion gun, a thermionic filament, tungsten filament, a cathode, a vacuum triode, a field emission cathode, a planar vacuum triode, an electron-impact ionizer, a laser ionizer, a chemical ionizer, a thermal ionizer, an ion-impact ionizer.

32. A method as in claim 30 wherein the charged particles are selected from the group comprising: positive ions, negative ions, electrons, and protons.

33. A method as in claim 25 wherein the ultra-small resonant structure is constructed and adapted to emit at least one of visible light, infrared light, and ultraviolet light.

34. A method as in claim 25 wherein the ultra-small resonant structure is formed on a surface of an integrated circuit (IC).

35. A method as in claim 34 further comprising:
electrically connecting said ultra-small resonant structure to said IC.

36. A method as in claim 25 further comprising:
vacuum packaging at least said ultra-small resonant structure.

37. A device comprising:
at least one ultra-small resonant structure constructed and adapted to detect electromagnetic radiation (EMR); and
shielding constructed and adapted to shield at least a portion of said ultra-small resonant structure with a high-permeability magnetic material.

38. A device as in claim 37 wherein said magnetic material is formed from a substance selected from a non-conductive magnetic oxide.

39. A device as in claim 38 wherein the non-conductive magnetic oxide is selected from the group comprising: a ferrite; a cobaltite, a chromite, and a manganite.

40. A device as in claim 39 wherein the ferrite is selected from the group comprising: $MnFe_2O_4$, $FeFe_2O_4$, $CoFe_2O_4$, $NiFe_2O_4$, $CuFe_2O_4$, and $MgFe_2O_4$.

41. A device as in claim 37 wherein the magnetic material comprises a metal selected from the group comprising: mumetal, permalloy, Hipernom, HyMu-80, supermalloy, supermumetal, nilomag, sanbold, Mo-Permalloy, Ultraperm, and M-1040.

42. A device as in any one of claims 37-41 wherein said ultra-small resonant structure includes a source of charged particles.

43. A device as in claim 42 wherein said source of charged particles is selected from the group comprising:
an ion gun, a thermionic filament, tungsten filament, a cathode, a vacuum triode, a field emission cathode, a planar vacuum triode, an electron-impact ionizer, a laser ionizer, a chemical ionizer, a thermal ionizer, an ion-impact ionizer.

44. A device as in claim 43 wherein the charged particles are selected from the group comprising: positive ions, negative ions, electrons, and protons.

45. A device as in claim 37 wherein the ultra-small resonant structure is constructed and adapted to emit at least one of visible light, infrared light, and ultraviolet light.

46. A device as in claim 37 wherein the ultra-small resonant structure is formed on a surface of an integrated circuit (IC).

47. A device as in claim 46 wherein the ultra-small resonant structure is electrically connected to said IC.

48. A device as in claim 37 wherein at least said ultra-small resonant structure is vacuum packaged.

* * * * *